(12) United States Patent
Takahashi et al.

(10) Patent No.: US 8,168,354 B2
(45) Date of Patent: May 1, 2012

(54) PHOTOSENSITIVE COMPOSITION, PARTITION WALLS, COLOR FILTER AND ORGANIC EL DEVICE

(75) Inventors: Hideyuki Takahashi, Tokyo (JP); Kenji Ishizeki, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/971,032

(22) Filed: Dec. 17, 2010

(65) Prior Publication Data

US 2011/0143282 A1    Jun. 16, 2011

Related U.S. Application Data

(63) Continuation of application No. PCT/JP2009/062153, filed on Jul. 2, 2009.

(30) Foreign Application Priority Data

Jul. 3, 2008    (JP) ................................. 2008-174974

(51) Int. Cl.
    *G03F 7/038*    (2006.01)
(52) U.S. Cl. ...................... 430/7; 430/287.1; 313/504
(58) Field of Classification Search .................. None
    See application file for complete search history.

(56) References Cited

U.S. PATENT DOCUMENTS

| | | | |
|---|---|---|---|
| 7,232,648 B2 | 6/2007 | Takahashi et al. | |
| 2005/0191580 A1* | 9/2005 | Takahashi et al. | ......... 430/270.1 |
| 2006/0003256 A1 | 1/2006 | Takahashi et al. | |

(Continued)

FOREIGN PATENT DOCUMENTS

JP    2004-151618    5/2004

(Continued)

OTHER PUBLICATIONS

International Search Report issued Aug. 4, 2009 in PCT/JP09/062153 filed Jul. 2, 2009.

(Continued)

*Primary Examiner* — John A. McPherson
(74) *Attorney, Agent, or Firm* — Oblon, Spivak, McClelland, Maier & Neustadt, L.L.P.

(57) ABSTRACT

It is an object of the present invention to provide a photosensitive composition capable of forming partition walls having an upper surface with good ink repellency and open areas which have good ink affinity within which an ink will easily spread. Further, it is an object of the present invention to provide partition walls formed by curing the photosensitive composition, and a color filter and an organic EL device having the partition walls.

The photosensitive composition is a photosensitive composition, which comprises a polymer (A) having a side chain containing a group represented by the formula:

$$-CFXR^f \qquad (1)$$

or a group represented by the formula:

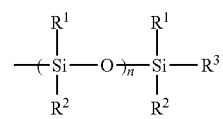

(2)

and a side chain containing an ethylenic double bond, a black colorant (B), a photopolymerization initiator (C), and a photosensitive resin (D) containing an acidic group and an ethylenic double bond, wherein the polymer (A) has a number average molecular weight of at least $2 \times 10^4$ and at most $7 \times 10^4$ and a weight average molecular weight of at least $5 \times 10^4$ and at most $25 \times 10^4$.

11 Claims, 1 Drawing Sheet

U.S. PATENT DOCUMENTS

| | | |
|---|---|---|
| 2007/0292805 A1 * | 12/2007 | Miura et al. ............... 430/286.1 |
| 2008/0254388 A1 | 10/2008 | Takahashi et al. |
| 2010/0035166 A1 | 2/2010 | Ishizeki et al. |
| 2010/0072889 A1 | 3/2010 | Takahashi et al. |

FOREIGN PATENT DOCUMENTS

| | | |
|---|---|---|
| JP | 2004-177948 | 6/2004 |
| JP | 2005-60515 | 3/2005 |
| JP | 2005-166645 | 6/2005 |
| JP | 2005-315983 | 11/2005 |
| WO | WO 2007/061115 A1 | 5/2007 |
| WO | 2007/069703 | 6/2007 |

OTHER PUBLICATIONS

Extended Search Report issued Dec. 21, 2011 in Europe Application No. 09773554.2.

* cited by examiner

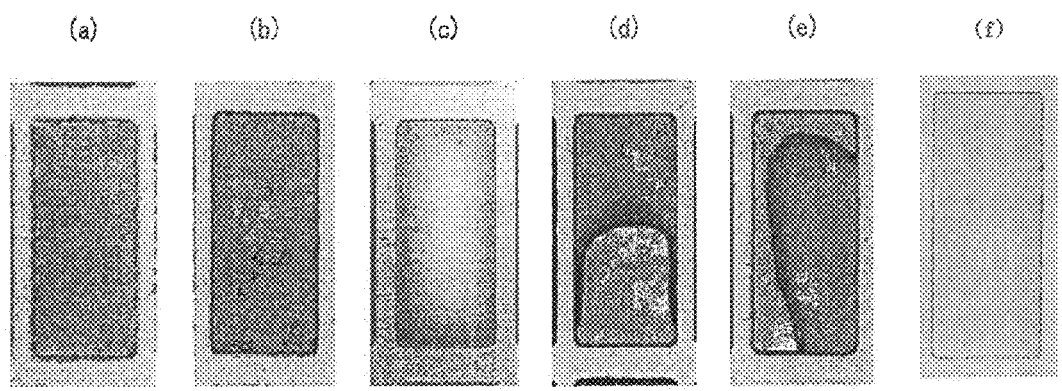

PHOTOSENSITIVE COMPOSITION, PARTITION WALLS, COLOR FILTER AND ORGANIC EL DEVICE

TECHNICAL FIELD

The present invention relates to a photosensitive composition, partition walls, a color filter and an organic EL device.

BACKGROUND ART

In recent years, a method utilizing an ink jet method has been known as a process for producing a color filter or an organic EL display. For example, in production of a color filter, a black matrix comprising partition walls is formed by photolithography, and then open areas of the black matrix are coated with inks of R (red), G (green) and B (blue) by an ink jet method to form pixels. Further, in production of an organic EL device, a black matrix comprising partition walls is formed by photolithography, and then open areas of the black matrix are coated with solutions of a hole transport material, a luminescent material and the like by an ink jet method to form pixels having a hole transport layer, a luminescent layer, etc.

In order to prevent color mixing between adjacent pixels of such a color filter or an organic EL device, the upper surface of the black matrix is required to have a repellency against an ink, i.e. a so-called ink repellency. Further, in order to prevent edge leakage of a color filter or an organic EL device, the open areas of the black matrix are required to have wettability to an ink, i.e. the so-called ink affinity.

Patent Document 1 discloses a composition (alkali development type photosensitive resist) for partition walls containing a vinyl polymer having ethylenically unsaturated double bonds and fluoroalkyl groups. The weight average molecular weights of the vinyl polymers disclosed in Examples are 20,000., 18,000., 22,000., 23,000. and 17,000.

Patent Document 2 discloses a negative photosensitive composition containing a fluoropolymer which is a compound obtained by reacting 1,1-bis(acryloyloxymethyl)ethyl isocyanate with a copolymer of 2-(perfluorohexyl)ethyl methacrylate with 2-hydroxyethyl methacrylate. The number average molecular weights of the fluoropolymer disclosed in Examples are 4,300., 7,300., 7,250. and 11,500.

PRIOR ART DOCUMENT

Patent Document
Patent Document 1: JP-A-2005-060515
Patent Document 2: WO2007/69703

DISCLOSURE OF THE INVENTION

Object to be Accomplished by the Invention

The present inventors have found that when partition walls are formed by using the composition disclosed in Patent Document 1 or 2, an ink hardly spread within open areas surrounded by the partition walls in some cases.

It is an object of the present invention to solve the above problems of prior art and to provide a photosensitive composition capable of forming partition walls having an upper surface with good ink repellency and open areas which have good ink affinity and within which an ink will easily spread. Further, it is an object of the present invention to provide partition walls formed by curing the photosensitive composition, and a color filter and an organic EL device having the partition walls.

Means to Accomplish the Object

The present invention provides the following.
[1] A photosensitive composition, which comprises a polymer (A) having a side chain containing a group represented by the formula:

wherein X is a hydrogen atom, a fluorine atom or a trifluoromethyl group, $R^f$ is a $C_{1-20}$ fluoroalkyl group which may have an etheric oxygen atom or a fluorine atom, or a group represented by the formula:

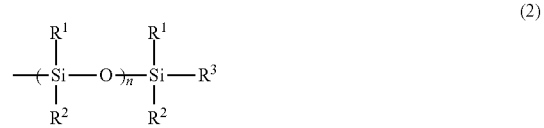

wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of at least 1 and at most 200; and a side chain containing an ethylenic double bond, a black colorant (B), a photopolymerization initiator (C), and a photosensitive resin (D) containing an acidic group and an ethylenic double bond, wherein the polymer (A) has a number average molecular weight of at least $2\times10^4$ and at most $7\times10^4$ and a weight average molecular weight of at least $5\times10^4$ and at most $25\times10^4$. Here, a fluoroalkyl group means an alkyl group having at least one hydrogen atom substituted by a fluorine atom.
[2] The photosensitive composition according to the above [1], wherein the polymer (A) is a polymer (A) having a side chain containing a group represented by the above formula (1) and a side chain containing an ethylenic double bond, and the content of fluorine atoms in the polymer (A) is from 5 to 35 mass %.
[3] The photosensitive composition according to the above [1], wherein the polymer (A) is a polymer (A) having a side chain containing a group represented by the above formula (2) and a side chain containing an ethylenic double bond, and the content of silicon atoms in the polymer (A) is from 0.1 to 25 mass %.
[4] The photosensitive composition according to any one of the above [1] to [3], wherein the photosensitive resin (D) has a weight average molecular weight of at least $1.5\times10^3$ and at most $20\times10^3$.
[5] The photosensitive composition according to any one of the above [1] to [4], wherein the polymer (A) has ethylenic double bonds in an amount of from 1.0 to 5.0 mmol/g.
[6] The photosensitive composition according to any one of the above [1] to [5], wherein the group represented by the above formula (1) is a perfluoroalkyl group.
[7] The photosensitive composition according to any one of the above [1] to [6], wherein the polymer (A) further has a side chain containing an acidic group.
[8] The photosensitive composition according to any one of the above [1] to [7], which further contains a crosslinking agent (E) containing at least two ethylenic double bonds.
[9] Partition walls formed by curing the photosensitive composition as defined in any one of the above [1] to [8].

[10] A color filter, which comprises a substrate and a plurality of pixels formed on the substrate, wherein the plurality of pixels are partitioned by the partition walls as defined in the above [9].

[11] An organic EL device, which comprises a substrate and a plurality of pixels formed on the substrate, wherein the plurality of pixels are partitioned by the partition walls as defined in the above [9].

Effects of the Invention

According to the photosensitive composition of the present invention, it is possible to form partition walls having an upper surface with good ink repellency and open areas within which an ink will easily spread. Further, according to the present invention, it is possible to provide partition walls formed by curing the photosensitive composition, and a color filter and an organic EL device having the partition walls.

BRIEF DESCRIPTION OF THE DRAWING

FIG. 1 is photographs illustrating results of evaluation of ink spreadability within open areas.

BEST MODE FOR CARRYING OUT THE INVENTION

Now, the present invention will be described in further detail below. In this specification, "%" means "mass %" unless otherwise specified. A (meth)acryloyl group generically means both an acryloyl group and a methacryloyl group. A (meth)acrylate generically means both an acrylate and a methacrylate. (Meth)acrylic acid generically means both acrylic acid and methacrylic acid. (Meth)acrylamide generically means both acrylamide and methacrylamide. Further, (meth)allyl generically means both allyl and methallyl. A group represented by the formula (1) will sometimes be referred to as a group (1). The same applies to other groups.

The photosensitive composition of the present invention comprises a polymer (A) having a side chain containing a group represented by the formula:

$$-CFXR^f \qquad (1)$$

wherein X is a hydrogen atom, a fluorine atom or a trifluoromethyl group, $R^f$ is a $C_{1-20}$ fluoroalkyl group which may have an etheric oxygen atom or a fluorine atom, or a group represented by the formula:

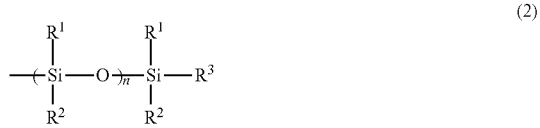

$$(2)$$

wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of from 1 to 200; and a side chain containing an ethylenic double bond, a black colorant (B), a photopolymerization initiator (C), and a photosensitive resin (D) containing an acidic group and an ethylenic double bond. The number average molecular weight of the polymer (A) is from $2\times10^4$ to $7\times10^4$, preferably from $2.2\times10^4$ to $6.5\times10^4$, more preferably from $2.5\times10^4$ to $6\times10^4$. Further, the weight average molecular weight of the polymer (A) is from $5\times10^4$ to $25\times10^4$, preferably from $5.5\times10^4$ to $22\times10^4$, more preferably from $6\times10^4$ to $20\times10^4$. The number average molecular weight and the weight average molecular weight are measured by means of a gel permeation chromatography method using polystyrene as the standard substance.

Since the polymer (A) has a side chain containing the group (1) or the group (2), it is likely to migrate, when a coating film formed by applying the photosensitive composition of the present invention is dried, to the vicinity of the surface of the coating film. Further, since the polymer (A) has a side chain containing an ethylenic double bond, it is likely to be cured at the time of exposure and fixed to the vicinity of the surface of the coating film. As a result, partition walls formed by developing the coating film after exposure have ink repellency on their upper surfaces. Accordingly, when open areas surrounded by the partition walls are coated with an ink by means of an ink jet method, color mixing of inks between adjacent open areas can be suppressed.

If the number average molecular weight of the polymer (A) less than $2\times10^4$, the open areas have insufficient ink affinity and when coated with an ink by means of an ink jet method, the ink will not sufficiently spread. If the number average molecular weight exceeds $7\times10^4$, the alkali solubility and developability will be insufficient. Further, if the weight average molecular weight of the polymer (A) is less than $5\times10^4$, the open areas will have insufficient ink affinity and when coated with an ink by means of an ink jet method, the ink will not sufficiently spread. If the weight average molecular weight exceeds $25\times10^4$, the alkali solubility and the developability will be insufficient.

The relation between the number average molecular weight or the weight average molecular weight of the polymer (A) and the ink affinity of the open areas is not clearly understood. In general, a photosensitive composition containing a black colorant has light shielding properties, and accordingly the curing reaction at the time of exposure will not sufficiently proceed in some cases, and the polymer (A) which has not been fixed may migrate to the side surfaces of the partition walls or may flow out to the open areas at the time of post baking in some cases. It is considered that the above phenomenon is suppressed when the polymer (A) has a number average molecular weight of at least $2\times10^4$ and a weight average molecular weight of at least $5\times10^4$.

The molecular weight distribution (weight average molecular weight/number average molecular weight) of the polymer (A) is preferably at most 8, more preferably at most 4. Within this range, good developability will be obtained.

In a case where the polymer (A) has a side chain containing the group (1), the content of fluorine atoms in the polymer (A) is preferably from 5 to 35%, more preferably from 10 to 30%, particularly preferably from 10 to 25%. If the content of fluorine atoms is less than 5%, the ink repellency on the upper surface of the partition walls is insufficient in some cases, and if it exceeds 35%, the adhesion between the partition walls and the substrate is decreased in some cases.

In a case where the polymer (A) has a side chain containing the group (2), the content of silicon atoms in the polymer (A) is preferably from 0.1 to 25%, more preferably from 0.5 to 10%, particularly preferably from 0.5 to 5%. If the content of silicon atoms is less than 0.1%, the ink repellency on the upper surface of the partition walls is insufficient in some cases, and if it exceeds 25%, the adhesion between the partition walls and the substrate is decreased in some cases.

The content of ethylenic double bonds in the polymer (A) is preferably from 1.0 to 5.0 mmol/g, more preferably from 2.5 to 4.5 mmol/g. When it is from 1.0 to 5.0 mmol/g, the polymer (A) will have good developability and fixing property to the partition walls.

The polymer (A) may have at least two types of side chains as the side chain containing the group (1), may have at least two types of side chains as the side chain containing the group (2), and may have at least two types of side chains containing an ethylenic double bond. This includes a case where the polymer (A) has a side chain containing the group (1) and a side chain containing the group (2). Further, the photosensitive composition of the present invention may contain both a polymer (A) having a side chain containing the group (1) and a side chain containing an ethylenic double bond and a polymer (A) having a side chain containing the group (2) and a side chain containing an ethylenic double bond.

The side chain containing the group (1) or the side chain containing the group (2) may be formed directly by the polymerization reaction or may be formed by a chemical conversion after the polymerization reaction.

In a case where $R^f$ in the group (1) is a $C_{1-20}$ fluoroalkyl group which may have an etheric oxygen atom, $R^f$ may have a halogen atom other than the fluorine atom, and the halogen atom is preferably a chlorine atom. Further, the structure of the fluoroalkyl group is not particularly limited, and it may, for example, be a linear structure, a branched structure, a cyclic structure or a structure partially having a cyclic structure, and is preferably a linear structure. Further, in a case where $R^f$ is a fluoroalkyl group containing an etheric oxygen atom, the etheric oxygen atom may be present in the carbon-carbon bond in the fluoroalkyl group, or may be present at the terminal of the fluoroalkyl group.

The $C_{1-20}$ fluoroalkyl group which may have an etheric oxygen atom is not particularly limited, and may, for example, be —$CF_3$, —$CF_2CF_3$, —$CF_2CHF_2$, —$(CF_2)_2CF_3$, —$(CF_2)_3CF_3$, —$(CF_2)_4CF_3$, —$(CF_2)_5CF_3$, —$(CF_2)_6CF_3$, —$(CF_2)_7CF_3$, —$(CF_2)_8CF_3$, —$(CF_2)_9CF_3$, —$(CF_2)_{11}CF_3$, —$(CF_2)_{15}CF_3$, —$CF(CF_3)O(CF_2)_5CF_3$, —$CF_2O(CF_2CF_2O)_p CF_3$ (wherein p is an integer of from 1 to 8), —$CF(CF_3)O(CF_2CF(CF_3)O)_q C_6F_{13}$ (wherein q is an integer of from 1 to 4) or —$CF(CF_3)O(CF_2CF(CF_3)O)_r C_3F_7$ (wherein r is an integer of from 1 to 5).

The group (1) is preferably a perfluoroalkyl group or a polyfluoroalkyl group having one hydrogen atom, particularly preferably a perfluoroalkyl group. The perfluoroalkyl group and the polyfluoroalkyl group include ones containing an etheric oxygen atom. In such a case, partition walls to be formed by using the photosensitive composition of the present invention have good ink repellency on the upper surface.

Further, the group (1) preferably has from 4 to 6 carbon atoms. In such a case, the compatibility of the polymer (A) with other components constituting the photosensitive composition will be improved, and accordingly coagulation of the polymer (A) in a coating film formed by applying the photosensitive composition will be suppressed and as a result, partition walls having good outer appearance will be formed.

In the group (2), a plurality of $R^1$'s and a plurality of $R^2$'s in the respective constituting units may be the same or different. Further, considering the ink repellency of partition walls formed by using the photosensitive composition, each of $R^1$ and $R^2$ which are independent of each other, is preferably a hydrogen atom, a methyl group or a phenyl group, and it is particularly preferred that $R^1$'s and $R^2$'s in all the siloxane units are methyl groups. Further, in a case where $R^3$ is an organic group, it may have a nitrogen atom, an oxygen atom or the like, and $R^3$ is preferably a hydrogen atom or a $C_{1-5}$ alkyl group. Further, n is preferably an integer of from 2 to 100.

The ethylenic double bond is not particularly limited and may, for example, be an addition-polymerizable group such as a (meth)acryloyl group, an allyl group, a vinyl group or a vinyloxy group.

The polymer (A) preferably further has a side chain containing an acidic group, whereby the polymer (A) which has not been cured by exposure will easily be removed from the upper surface of the partition walls at the time of development. Accordingly, flow of the uncured polymer (A) to the open areas at the time of post baking can be suppressed, and the ink affinity of the open areas can be improved. Further, the polymer (A) may have a side chain containing at least two acidic groups.

The acidic group is not particularly limited and may, for example, be a carboxy group, a phenolic hydroxy group or a sulfonic acid group.

The polymer (A) preferably has an acid value of at most 100 mgKOH/g, more preferably from 10 to 50 mgKOH/g. Within this range, the polymer (A) which has not been fixed by exposure will easily be removed from the upper surface of the partition walls at the time of development. The acid value is the mass (mg) of potassium hydroxide required to neutralize 1 g of a sample, and in this specification, the unit is identified by mgKOH/g.

The side chain containing an acidic group may be formed directly by the polymerization reaction or may be formed by a chemical conversion after the polymerization reaction.

In the present invention, the polymer (A) is prepared by reacting a copolymer obtained by copolymerizing a monomer containing the group (1) or a monomer containing the group (2), a monomer containing a reactive group and as the case requires, a monomer containing an acidic group and/or other monomer, with a compound having a functional group capable of being bonded to the reactive group and an ethylenic double bond.

The monomer containing the group (1) is preferably a compound represented by the formula:

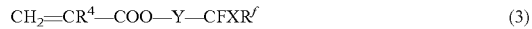

$$CH_2=CR^4-COO-Y-CFXR^f \quad (3)$$

wherein $R^4$ is a hydrogen atom, a fluorine atom, a chlorine atom, a bromine atom, an iodine atom, a trifluoromethyl group, a $C_{1-20}$ fluoroalkyl group which may have an etheric oxygen atom, a cyano group, a $C_{1-20}$ alkyl group, an alkyl group substituted by a $C_{7-20}$ aryl group, a $C_{6-20}$ aryl group or a $C_{3-20}$ cycloalkyl group, Y is a single bond or a $C_{1-6}$ bivalent organic group containing no fluorine atom, X is a hydrogen atom, a fluorine atom or a trifluoromethyl group, and $R^f$ is a $C_{1-20}$ fluoroalkyl group which may have an etheric oxygen atom, or a fluorine atom, and such monomers may be used in combination of two or more. The preferred embodiment of —$CFXR^f$ is as defined for the above group (1). Further, Y may, for example, be —$R^5$—, —$R^5$—$NR^6$—$SO_2$—, —$R^5$—$NR^6$—$CO$— or —$CH_2CH(OH)$—$R^7$— (wherein $R^5$ is a $C_{1-6}$ alkylene group, $R^6$ is a hydrogen atom or a methyl group, and $R^7$ is a single bond or a $C_{1-4}$ alkylene group), and is preferably a $C_{2-4}$ alkylene group in view of availability.

$R^4$ may, for example, be a hydrogen atom, a fluorine atom, a chlorine atom, a methyl group, a trifluoromethyl group, a phenyl group or a benzyl group, and is preferably a hydrogen atom, a fluorine atom, a chlorine atom, a methyl group or a trifluoromethyl group.

$R^5$ may, for example, be —$CH_2$—, —$CH_2CH_2$—, —$CH(CH_3)$—, —$CH_2CH_2CH_2$—, —$C(CH_3)_2$—, —$CH(CH_2CH_3)$—, —$CH_2CH_2CH_2CH_2$—, —$CH(CH_2CH_2CH_3)$—, —$CH_2(CH_2)_3CH_2$— or —$CH(CH_2CH(CH_3)_2)$—.

R⁷ may, for example, be —CH₂—, —CH₂CH₂—, —CH(CH₃)—, —CH₂CH₂CH₂—, —C(CH₃)₂—, —CH(CH₂CH₃)—, —CH₂CH₂CH₂CH₂— or —CH(CH₂CH₂CH₃)—.

The compound represented by the formula (3) may, for example, be 2-(perfluorohexyl)ethyl(meth)acrylate or 2-(perfluorobutyl)ethyl(meth)acrylate.

The monomer containing the group (2) is preferably a compound represented by the formula:

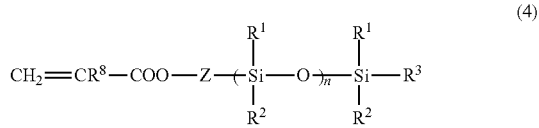

(4)

wherein R⁸ is a hydrogen atom or a methyl group, Z is a single bond or a C₁₋₆ bivalent organic group, each of R¹ and R² which are independent of each other, is a hydrogen atom, an alkyl group, a cycloalkyl group or an aryl group, R³ is a hydrogen atom or a C₁₋₁₀ organic group, and n is an integer of from 1 to 200, and such monomers may be used in combination of two or more. The preferred embodiments of R¹, R², R³ and n are as defined for the above group (2). Further, Z is preferably a C₁₋₆ bivalent hydrocarbon group, and may, for example, be —CH₂—, —CH₂CH₂—, —CH(CH₃)—, —CH₂CH₂CH₂—, —C(CH₃)₂—, —CH(CH₂CH₃)—, —CH₂CH₂CH₂CH₂—, —CH(CH₂CH₂CH₃)—, —CH₂(CH₂)₃CH₂— or —CH(CH₂CH(CH₃)₂)—.

The monomer containing a reactive group is not particularly limited, and may, for example, be a monomer containing a hydroxy group, an acid anhydride containing an ethylenic double bond, a monomer containing a carboxy group or a monomer containing an epoxy group, and such monomers may be used in combination of two or more. The monomer containing a reactive group preferably contains substantially no group (1) nor group (2).

The monomer containing a hydroxy group may, for example, be 2-hydroxyethyl(meth)acrylate, 2-hydroxypropyl(meth)acrylate, 3-hydroxypropyl(meth)acrylate, 4-hydroxybutyl(meth)acrylate, 5-hydroxypentyl(meth)acrylate, 6-hydroxyhexyl (meth)acrylate, 4-hydroxycyclohexyl(meth) acrylate, neopentyl glycol mono(meth)acrylate, 3-chloro-2-hydroxypropyl(meth)acrylate, glycerol mono(meth)acrylate, 2-hydroxyethyl vinyl ether, 4-hydroxybutyl vinyl ether, cyclohexanediol monovinyl ether, 2-hydroxyethyl allyl ether, N-hydroxymethyl(meth)acrylamide or N,N-bis(hydroxymethyl)(meth)acrylamide.

Further, the monomer containing a hydroxy group may contain a polyoxyalkylene group the terminal of which is a hydroxy group, and it may, for example, be CH₂=CHOCH₂C₆H₁₀CH₂O(CH₂CH₂O)ₖH, CH₂=CHOC₄H₈O(CH₂CH₂O)ₖH, CH₂=CHCOOCH₂CH₂O(CH₂CH₂O)ₖH, CH₂=C(CH₃)COOCH₂CH₂O(CH₂CH₂O)ₖH, CH₂=CHCOOCH₂CH₂O(CH₂CH₂O)ₘ(C₃H₆O)ⱼH or CH₂=C(CH₃)COOC₂H₄O(CH₂CH₂O)ₘ(C₃H₆O)ⱼH (wherein k is an integer of form 1 to 100, m is an integer of from 0 to 100, j is an integer of from 1 to 100, and m+j is from 1 to 100). The above C₆H₁₀ represents a cyclohexylene group, C₄H₈ a n-butylene group, and C₃H₆ a 2-propylene group.

The acid anhydride containing an ethylenic double bond may, for example, be maleic anhydride, itaconic anhydride, citraconic anhydride, methyl-5-norbornene-2,3-dicarboxylic anhydride, 3,4,5,6-tetrahydrophthalic anhydride, cis-1,2,3,6-tetrahydrophthalic anhydride or 2-buten-1-yl succinic anhydride.

The monomer containing a carboxy group may, for example, be acrylic acid, methacrylic acid, vinyl acetate, crotonic acid, itaconic acid, maleic acid, fumaric acid, cinnamic acid or a salt thereof.

The monomer containing an epoxy group may, for example, be glycidyl (meth)acrylate or 3,4-epoxycyclohexylmethyl acrylate.

The monomer containing an acidic group may, for example, be a monomer containing a carboxy group, a monomer containing a phenolic hydroxy group or a monomer containing a sulfonic acid group, and such monomers may be used in combination of two or more. In a case where a monomer containing a carboxy group is used as the monomer containing an acidic group and a monomer containing a carboxy group is used also as the above monomer containing a reactive group, one having no ethylenic double bond finally introduced and having a residual carboxy group, will be deemed to be the monomer.

The monomer containing a phenolic hydroxy group may, for example, be o-hydroxystyrene, m-hydroxystyrene or p-hydroxystyrene, or a compound having at least one hydrogen atom in such a benzene ring substituted by an alkyl group such as a methyl group, an ethyl group or a n-butyl group, an alkoxy group such as a methoxy group, an ethoxy group or a n-butoxy group, a halogen atom, a haloalkyl group having at least one halogen atom, a nitro group, a cyano group, or an amide group.

The monomer containing a sulfonic acid group may, for example, be vinyl sulfonic acid, styrene sulfonic acid, (meth) allyl sulfonic acid, 2-hydroxy-3-(meth)allyloxypropane sulfonic acid, 2-sulfoethyl(meth)acrylate, 2-sulfopropyl(meth) acrylate, 2-hydroxy-3-(meth)acryloxypropane sulfonic acid, or 2-(meth)acrylamide-2-methylpropane sulfonic acid.

Other monomer may, for example, be a hydrocarbon type olefin, a vinyl ether, an isopropenyl ether, an allyl ether, a vinyl ester, an allyl ester, a (meth)acrylate, a (meth)acrylamide, an aromatic vinyl compound, a chloroolefin or a conjugated diene, and considering the heat resistance of the partition walls, it is preferably a (meth)acrylate or a (meth) acrylamide. Such a compound may contain a functional group such as a carbonyl group or an alkoxy group.

The proportion of the mass of the monomer containing the group (1) or the monomer containing the group (2) based on the total mass of monomers to be copolymerized is preferably from 20 to 80%, more preferably from 30 to 60%. If this proportion is too low, the polymer (A) hardly migrates to the vicinity of the upper surface of partition walls to be formed by using the photosensitive composition of the present invention, whereby the ink repellency of the upper surface of the partition walls is insufficient in some cases. If the proportion is too high, the adhesion between the partition walls and the substrate is decreased in some cases.

The proportion of the mass of the monomer containing a reactive group to the total mass of monomers to be copolymerized is preferably from 20 to 70%, more preferably from 30 to 50%. Within such a range, the polymer (A) will have good developability and fixing property to the partition walls.

The proportion of the mass of the monomer containing an acidic group based on the total mass of monomers to be copolymerized is preferably from 2 to 20%, more preferably from 4 to 12%. Within such a range, the polymer (A) which has not been cured by exposure will be readily washed off from the portion walls at the time of development.

The proportion of the mass of other monomer based on the total mass of monomers to be copolymerized is preferably at most 70%, more preferably at most 50%. If the proportion of the mass exceed 70%, the alkali developability is decreased in some cases.

The copolymer having a side chain containing the group (1) or the group (2) and a side chain containing a reactive group and as the case requires, a side chain containing an acidic group may be prepared by dissolving the monomer containing the group (1) or the monomer containing the group (2) and the monomer containing a reactive group and as the case requires, the monomer containing an acidic group and/or other monomer in a solvent, heating the solution, and adding a polymerization initiator to conduct copolymerization. At the time of copolymerization, it is preferred to add a chain transfer agent as the case requires. Further, the monomers, the polymerization initiator, the solvent and the chain transfer agent may be continuously added.

As the polymerization initiator, the solvent and the chain transfer agent, ones disclosed in paragraphs [0053] to [0056] in WO2007/69703 may be used.

The following combinations may, for example, be mentioned as a combination of a reactive group to a compound containing a functional group capable of being bonded to the reactive group and an ethylenic double bond and a compound having an ethylenic double bond.

(1) A hydroxy group to an acid anhydride containing an ethylenic double bond.

(2) A hydroxy group to a compound containing an isocyanate group and an ethylenic double bond.

(3) A hydroxy group to a compound containing a chlorinated acyl group and an ethylenic double bond.

(4) An acid anhydride to a compound containing a hydroxy group and an ethylenic double bond.

(5) A carboxy group to a compound containing an epoxy group and an ethylenic double bond.

(6) An epoxy group to a compound containing a carboxy group and an ethylenic double bond.

The compound containing an isocyanate group and an ethylenic double bond may, for example, be 2-(meth)acryloyloxyethyl isocyanate or 1,1-bis((meth)acryloyloxymethyl)ethyl isocyanate. Particularly, the polymer (A) having a side chain containing at least two ethylenic double bonds is likely to be fixed to the vicinity of the upper surface of the partition walls, thus improving the ink repellency of the upper surface of the partition walls, and accordingly preferred is 1,1-bis ((meth)acryloyloxymethyl)ethyl isocyanate. The compound containing a chlorinated acyl group and an ethylenic double bond may, for example, be (meth)acryloyl chloride. The acid anhydride containing an ethylenic double bond may be one exemplified for the above-described monomer containing a reactive group. The compound containing a hydroxy group and an ethylenic double bond may be one exemplified for the above-described monomer containing a hydroxy group. The compound containing an epoxy group and an ethylenic double bond may be one exemplified for the above-described monomer containing an epoxy group. The compound containing a carboxy group and an ethylenic double bond may be one exemplified for the above-described monomer containing a carboxy group.

When the copolymer having a side chain containing the group (1) or the group (2), a side chain containing a reactive group and as the case requires, a side chain containing an acidic group is reacted with a compound containing a functional group capable of being bonded to the reactive group and an ethylenic double bond, the equivalent ratio of the functional group of the above compound to the reactive group of the above copolymer is preferably from 0.5 to 2.0, more preferably from 0.8 to 1.5. If the equivalent ratio is less than 0.5, the polymer (A) is less likely to be fixed to the vicinity of the upper surface of the partition walls, whereby the ink affinity of the open areas surrounded by the partition walls is insufficient in some cases, and if it exceeds 2.0, an unreacted compound will increase, whereby the appearance of the partition walls is deteriorated in some cases.

The polymer (A) can be prepared by dissolving a copolymer having a side chain containing the group (1) or the group (2) and a side chain containing a reactive group and as the case requires, a side chain containing an acidic group, and a compound containing a functional group capable of being bonded to the reactive group and an ethylenic double bond, in a solvent for the reaction.

As described above, the side chain containing an acidic group in the polymer (A) may be formed by a chemical conversion after the polymerization reaction. For example, a copolymer having a side chain containing the group (1) or the group (2) and a side chain containing a reactive group and a compound containing a functional group capable of being bonded to the reactive group and an ethylenic double bond are reacted, and then an acidic group is formed. Specifically, in the case of the above combination (6), a hydroxy group formed by reaction of an epoxy group with a carboxy group, and a polybasic acid anhydride (such as maleic anhydride) are reacted to introduce carboxy groups in the polymer (A).

The content of the polymer (A) in the total solid content of the photosensitive composition of the present invention is preferably from 0.01 to 30%, more preferably from 0.05 to 20%. If the content is too low, the ink affinity of the upper surface of the partition walls to be formed by using the photosensitive composition of the present invention is insufficient in some cases, and if the content is too high, the adhesion between the partition walls and the substrate is decreased in some cases.

The black colorant (B) is not particularly limited and may, for example, be carbon black, aniline black, anthraquinone black pigment, a metal oxide such as titanium black, metal particles of e.g. a silver-tin alloy, or perylene black pigment, and specifically, it may, for example, be C.I. Pigment Black 1, 6, 7, 12, 20 or 31. Further, the black colorant (B) may be a mixture of organic or inorganic pigments of e.g. red, blue and green pigments. Particularly, carbon black is preferred considering the good light shielding properties. Such carbon black may be surface-treated with e.g. a resin. Further, in order to adjust the color tone of the black colorant (B), a blue pigment or a purple pigment may be used in combination with carbon black.

Further, the carbon black is preferably one having a specific surface area of from 50 to 200 $m^2/g$ as measured by BET method. If the specific surface area is too small, the shape of the partition walls is deteriorated in some cases, and if the specific surface area is too large, a dispersion aid is likely to be excessively adsorbed on the carbon black, whereby it will be required to add a large amount of a dispersion aid in some cases.

Further, considering the exposure sensitivity of the photosensitive composition, the carbon black has dibutyl phthalate oil absorption of preferably at most 120 cc/100 g, and the smaller the oil absorption, the better.

Further, the average primary particle size of carbon black is preferably from 20 to 50 nm. If the average primary particle size is too small, it tends to be difficult to disperse carbon black at a high concentration, whereby a photosensitive composition having good stability with time will hardly be obtained. If the average primary particle size is too large, the shape of the partition walls is deteriorated in some cases. Further, the average secondary particle size of carbon black is preferably from 80 to 200 nm. The particle size of carbon black is measured by a transmission electron microscope.

The content of the black colorant (B) in the total solid content in the photosensitive composition of the present invention is preferably from 15 to 60%, more preferably from 20 to 50%, particularly preferably from 25 to 40%. If the content is too low, the optical density of the partition walls is insufficient in some cases, and if the content is too high, the curing properties of the photosensitive composition is decreased, the outer appearance of the partition walls is deteriorated, and the ink repellency is decreased in some cases.

The photosensitive composition of the present invention preferably contains a polymer dispersing agent in order to improve dispersibility of the black colorant (B). The polymer dispersing agent is not particularly limited and may, for example, be a urethane type, a polyimide type, an alkyd type, an epoxy type, a polyester type, a melamine type, a phenol type, an acrylic type, a polyether type, a vinyl chloride type, a vinyl chloride/vinyl acetate copolymer type, a polyamide type or a polycarbonate type, and is preferably a urethane type or a polyester type. Further, the polymer dispersing agent may have constituting units derived from ethylene oxide and/or propylene oxide.

The polymer dispersing agent preferably has a basic group considering the affinity to the black colorant (B). The basic group is not particularly limited and may, for example, be a primary, secondary or tertiary amino group.

Commercial products of the polymer dispersing agent may, for example, be DISPERLON DA-7301 (manufactured by Kusumoto Chemicals, Ltd.), BYK161, BYK162, BYK163 and BYK182 (manufactured by BYK-Chemie), and Solsperse 5000 and Solsperse 17000 (manufactured by Zeneca Pigments & Additives).

The amount of addition of the polymer dispersing agent is preferably from 5 to 30%, more preferably from 10 to 25% based on the black colorant (B). If the addition amount is too small, the effect of improving the dispersibility is insufficient in some cases, and if the addition amount is too large, the developability is decreased in some cases.

Further, the photosensitive composition of the present invention may contain, as a dispersion aid, a phthalocyanine pigment derivative or a metal phthalocyanine sulfonamide compound. The dispersion aid is considered to be adsorbed on the black colorant (B) and the polymer dispersing agent thereby to improve the dispersion stability.

The photopolymerization initiator (C) is not particularly limited and may, for example, be an α-diketone such as benzil, diacetyl, methyl phenyl glyoxylate or 9,10-phenanthrenequinone; an acyloin such as benzoin; an acyloin ether such as benzoin methyl ether, benzoin ethyl ether or benzoin isopropyl ether; a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morpholino-1-propanone or 2-benzyl-2-dimethylamino-1-(4-morpholinophenyl)-butan-1-one; a quinone such as anthraquinone, 2-ethylantraquinone, camphorquinone or 1,4-naphthoquinone; an aminobenzoic acid such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate; a halogen compound such as phenacyl chloride or trihalomethylphenylsulfone; an acylphosphine oxide; a peroxide such as di-t-butyl peroxide; or an oxime ester such as 1,2-octanedione, 1-[4-(phenylthio)-, 2-(0-benzoyloxime)] or ethanone 1-[9-ethyl-6-(2-methylbenzoyl)-9H-carbazoyl-3-yl]-1-(O-acetyloxime), and they may be used in combination of two or more. Particularly preferred is a compound represented by the formula:

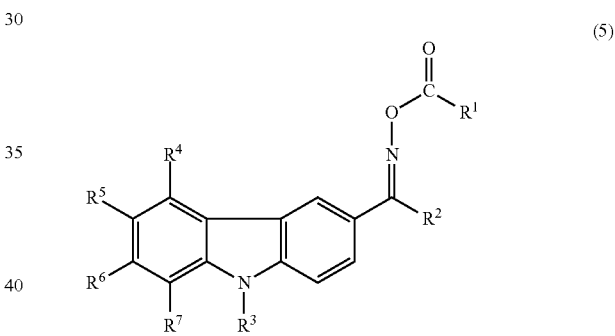

(5)

wherein $R^1$ is a hydrogen atom, a $C_{1-12}$ alkyl group, a $C_{3-8}$ cycloalkyl group, a $C_{2-5}$ alkenyl group, a $C_{6-20}$ phenyl group substituted by an alkyl group or unsubstituted, or a $C_{6-20}$ phenoxy group substituted by an alkyl group or unsubstituted, $R^2$ is a hydrogen atom, a $C_{1-20}$ alkyl group, a $C_{3-8}$ cycloalkyl group, a $C_{6-20}$ phenyl group substituted by an alkyl group or unsubstituted, a $C_{2-20}$ alkanoyl group, $C_{7-20}$ benzoyl group substituted by an alkyl group or unsubstituted, a $C_{2-12}$ alkoxycarbonyl group or a $C_{7-20}$ phenoxycarbonyl group substituted by an alkyl group or unsubstituted, $R^3$ is a $C_{1-12}$ alkyl group, and each of $R^4$, $R^5$, $R^6$ and $R^7$ which are independent of one another, is a hydrogen atom, a $C_{1-12}$ alkyl group, a $C_{3-8}$ cyclohexyl group substituted by an alkyl group or unsubstituted, a $C_{6-20}$ phenyl group substituted by an alkyl group or unsubstituted, a $C_{2-20}$ alkanoyl group, a $C_{7-20}$ benzoyl group substituted by an alkyl group or unsubstituted, a $C_{7-20}$ benzylcarbonyl group substituted by an alkyl group or unsubstituted, a $C_{2-12}$ alkoxycarbonyl group, a $C_{7-20}$ phenoxycarbonyl group substituted by an alkyl group or unsubstituted, a $C_{1-20}$ amide group, or a nitro group.

In the compound represented by the formula (5), $R^1$ is preferably a $C_{1-10}$ alkyl group or a $C_{6-12}$ phenyl group substituted by an alkyl group or unsubstituted, and may, for example, be a methyl group, an ethyl group, a propyl group, a butyl group, a pentyl group, a hexyl group, a heptyl group, an octyl group, a nonyl group, a decyl group or a phenyl group. Particularly, it is preferably a $C_{1-4}$ alkyl group, more preferably a $C_{1-2}$ alkyl group, particularly preferably a methyl group.

In the compound represented by the formula (5), $R^2$ is preferably a $C_{1-10}$ alkyl group or a $C_{2-5}$ alkoxycarbonyl group and may, for example, be a methyl group, an ethyl group, a propyl group, a butyl group, a pentyl group, a hexyl group, a heptyl group, an octyl group, a nonyl group, a decyl group, a methoxycarbonyl group, an ethoxycarbonyl group or a propoxycarbonyl group. Particularly, it is preferably a $C_{1-6}$ alkyl group, more preferably a $C_{1-3}$ alkyl group, particularly preferably a methyl group.

In the compound represented by the formula (5), $R^3$ is preferably a $C_{1-8}$ alkyl group and may, for example, be a methyl group, an ethyl group, a propyl group, a butyl group, a pentyl group, a hexyl group, a heptyl group, an octyl group, a nonyl group, a decyl group, an undecyl group or a dodecyl group. Particularly, it is preferably a $C_{2-6}$ alkyl group, particularly preferably an ethyl group.

In the compound represented by the formula (5), each of $R^4$, $R^6$ and $R^7$ is preferably a hydrogen atom.

In the compound represented by the formula (5), $R^5$ is preferably a $C_{7-20}$ benzoyl group substituted by an alkyl group or unsubstituted, or a $C_{7-20}$ benzylcarbonyl group substituted by an alkyl group or unsubstituted, particularly preferably a 2-methylbenzoyl group, a benzylcarbonyl group or a 1,3,5-trimethylbenzylcarbonyl group.

The compound (O-acyloxime compound) represented by the formula (5) is not particularly limited, and may, for example, be a compound of the formula (5) wherein $R^1$ is a phenyl group, $R^2$ is an octyl group, $R^3$ is an ethyl group, $R^4$, $R^6$ and $R^7$ are a hydrogen atom and $R^5$ is a benzoyl group; the compound wherein $R^1$ is a methyl group, $R^2$ is a butyl group, a heptyl group or an octyl group, $R^3$ is an ethyl group, $R^4$, $R^6$ and $R^7$ are a hydrogen atom, and $R^5$ is a benzoyl group; the compound wherein $R^1$ is a phenyl group, $R^2$ is an octyl group, $R^3$ is an ethyl group, $R^4$, $R^6$ and $R^7$ are a hydrogen atom, and $R^5$ is a 2-methylbenzoyl group; the compound wherein $R^1$ is a methyl group, $R^2$ is a methyl group or an octyl group, $R^3$ is an ethyl group, $R^4$, $R^6$ and $R^7$ are a hydrogen atom, and $R^5$ is a 2-methylbenzoyl group; or the compound wherein $R^1$ and $R^2$ are a methyl group, $R^3$ is an ethyl group, $R^4$, $R^6$ and $R^7$ are a hydrogen atom, and $R^5$ is a 2-methyl-5-tetrahydrofuranyl methoxybenzoyl group, a 2-methyl-4-tetrahydropyranyl methoxybenzoyl group or a 2-methyl-5-tetrahydropyranyl methoxybenzoyl group.

The content of the photopolymerization initiator (C) in the total solid content of the photosensitive composition of the present invention is preferably from 1 to 10%, more preferably from 2 to 5%. When it is from 1 to 10%, good curing property will be achieved, and a pattern and a line width close to a mask pattern can be formed by exposure and development.

Further, by use of, in combination with the photopolymerization initiator (C), a thiol compound such as 2-mercaptobenzimidazole, 2-mercaptobenzoxazole, 2-mercaptobenzothiazole, 1,4-butanolbis(3-mercaptobutyrate), tris(2-mercaptopropanoyloxyethyl)isocyanurate or pentaerythritol tetrakis(3-mercaptobutyrate), a sensitizing effect is developed in some cases.

The photosensitive resin (D) has an acidic group and an ethylenic double bond in one molecule, and accordingly the non-exposed portion of an uncured photosensitive composition can be selectively removed by an alkali developer and as a result, partition walls can be formed. The photosensitive resin (D) is a compound other than the polymer (A), and preferably contains substantially no group (1) nor group (2).

The acidic group is not particularly limited and may, for example, be a carboxy group, a phenolic hydroxy group, a sulfonic acid group or a phosphoric acid group, and such groups may be used in combination of two or more.

The ethylenic double bond is not particularly limited and may be a double bond which an addition-polymerizable group such as a (meth)acryloyl group, an allyl group, a vinyl group or a vinyloxy group has, and such bonds may be used in combination of two or more. Further, a part of or all the hydrogen atoms which such an addition-polymerizable group has may be substituted by a hydrocarbon group(s), preferably a methyl group(s).

The photosensitive resin (D) is not particularly limited and may, for example, be a resin (D-1) having a side chain containing an acidic group and a side chain containing an ethylenic double bond or a resin (D-2) having an ethylenic double bond and an acidic group introduced to an epoxy resin, and such resins may be used in combination of two or more.

The resin (D-1) can be prepared in the same manner as in the preparation of the polymer (A) except that the monomer containing the group (1) or the monomer containing the group (2) is not used. Further, a monomer containing a phosphoric acid group is not particularly limited and may, for example, be 2-(meth)acryloyloxyethane phosphoric acid.

The resin (D-2) can be prepared by reacting an epoxy resin with a compound containing a carboxy group and an ethylenic double bond, followed by reaction with a polybasic carboxylic acid or its anhydride. Specifically, by a reaction of an epoxy resin with a compound containing a carboxy group and an ethylenic double bond, an ethylenic double bond is introduced to the epoxy resin. Then, by reacting the epoxy resin having an ethylenic double bond introduced with a polybasic carboxylic acid or its anhydride, a carboxy group can be introduced.

The epoxy resin is not particularly limited and may, for example, be a bisphenol A type epoxy resin, a bisphenol F type epoxy resin, a phenol novolac type epoxy resin, a cresol novolac type epoxy resin, a trisphenolmethane type epoxy resin, an epoxy resin having a naphthalene skeleton, an epoxy resin having a biphenyl skeleton represented by the formula:

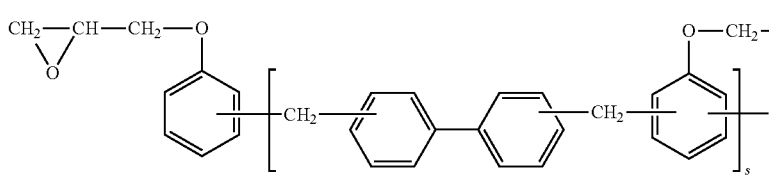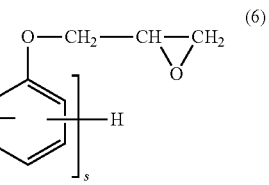

(6)

wherein s is from 1 to 50, preferably from 2 to 10, or an epoxy resin represented by the formula:

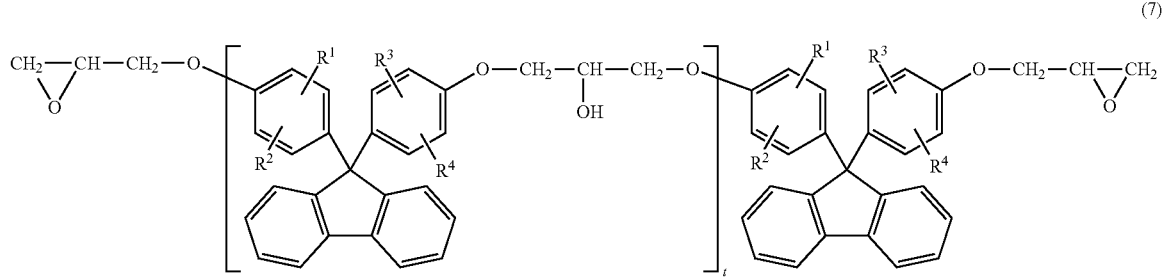

(7)

wherein each of $R^1$, $R^2$, $R^3$ and $R^4$ which are independent of one another, is a hydrogen atom, a chlorine atom or a $C_{1-5}$ alkyl group, and t is from 0 to 10.

In a case where the epoxy resin represented by the formula (7) is reacted with a compound containing a carboxy group and an ethylenic double bond, and then a polybasic carboxylic anhydride is reacted therewith, it is preferred to use, as the polybasic carboxylic anhydride, a mixture of dicarboxylic anhydride and tetracarboxylic dianhydride. By changing the ratio of dicarboxylic anhydride and tetracarboxylic dianhydride, the molecular weight can be controlled.

Commercial products of the resin (D-2) having an acidic group and an ethylenic double bond introduced to an epoxy resin may, for example, be KAYARAD PCR-1069, K-48C, CCR-1105, CCR-1115, CCR-1163H, CCR-1166H, CCR-1159H, TCR-1025, TCR-1064H, TCR-1286H, ZAR-1535H, ZFR-1122H, ZFR-1124H, ZFR-1185H, ZFR-1492H, ZCR-1571H, ZCR-1569H, ZCR-1580H, ZCR-1581H, ZCR-1588H and ZCR-1629H (all manufactured by Nippon Kayaku Co., Ltd.).

The photosensitive resin (D) has a weight average molecular weight of preferably from $1.5 \times 10^3$ to $20 \times 10^3$, more preferably from $2.0 \times 10^3$ to $15 \times 10^3$. If the weight average molecular weight is less than $1.5 \times 10^3$, curing at the time of exposure is insufficient in some cases, and if it exceeds $20 \times 10^3$, the developability is decreased in some cases.

The number of the ethylenic double bonds which the photosensitive resin (D) has is preferably at least 3 in one molecule, more preferably at least 6, on the average. When the number of the ethylenic double bonds is at least 3, it is possible that the difference in alkali solubility may readily be made between an exposed portion and a non-exposed portion, and it becomes possible to form a fine pattern with less light exposure.

The photosensitive resin (D) has an acid value of preferably from 10 to 300 mgKOH/g, more preferably from 30 to 150 mgKOH/g. If it is from 10 to 300 mgKOH/g, the developability of the photosensitive composition will be good.

The content of the photosensitive resin (D) in the total solid content of the photosensitive composition of the present invention is preferably from 5 to 80%, more preferably from 10 to 60%. When it is from 5 to 80%, the developability of the photosensitive composition will be good.

The photosensitive composition of the present invention preferably contains a crosslinking agent (E) containing at least two ethylenic double bonds, whereby the curing property of the photosensitive composition will be improved, and light exposure when partition walls are formed can be reduced. The crosslinking agent (E) preferably contains substantially no acidic group.

The crosslinking agent (E) is not particularly limited and may, for example, be diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth)acrylate, pentaerythritol tri(meth)acrylate, pentaerythritol tetra(meth)acrylate, ditrimethylolpropane tetra(meth)acrylate, dipentaerythritol hexa(meth)acrylate, ethoxylated isocyanuric acid triacrylate or urethane acrylate, and they may be used in combination of two or more.

The content of the crosslinking agent (E) in the total solid content of the photosensitive composition of the present invention is preferably from 5 to 50%, more preferably from 10 to 30%. When it is from 5 to 50%, the developability of the photosensitive composition will be good.

The photosensitive composition of the present invention may contain fine particles as the case requires, whereby a change of the shape of the partition walls at the time of post baking can be suppressed.

The fine particles are not particularly limited and may, for example, be inorganic fine particles of e.g. silica, zirconia, magnesium fluoride, ITO or ATO; or organic fine particles of e.g. polyethylene or PMMA. Considering the heat resistance, inorganic fine particles are preferred, and considering the availability and dispersion stability, silica or zirconia is preferred. Further, considering the absorption performance of the polymer dispersing agent used to improve the dispersibility of the black colorant (B), the fine particles are preferably negatively charged. Further, considering the exposure sensitivity of the photosensitive composition, it is preferred that the fine particles do not absorb light applied at the time of exposure, and it is more preferred that they do not absorb i-line (365 nm), h-line (405 nm) and g-line (436 nm) which are dominant wavelengths of an ultrahigh pressure mercury lamp.

The fine particles have an average particle size of preferably at most 1 μm, more preferably at most 200 nm, whereby good surface smoothness of the partition walls will be achieved.

The content of the fine particles in the total solid content of the photosensitive composition of the present invention is preferably from 3 to 20%, more preferably from 5 to 15%. If the content is too low, the shape of the partition walls is changed at the time of post baking in some cases, and if the content is too high, the dispersion stability of the photosensitive composition is decreased in some cases.

The photosensitive composition of the present invention may contain a silane coupling agent as the case requires, whereby the adhesion between the partition walls and the substrate can be improved.

The silane coupling agent is not particularly limited and may, for example, be triethoxysilane, 3-glycidoxypropyl trimethoxysilane, methyltrimethoxysilane, vinyltrimethoxysilane, 3-methacryloyloxypropyl trimethoxysilane, 3-chloropropyl trimethoxysilane, 3-mercaptopropyl trimethoxysilane, heptadecafluorooctylethyl trimethoxysilane, N-phenyl-3-aminopropyl trimethoxysilane, a polyoxyalkylene containing a triethoxysilyl group, or imidazolesilane, and they may be used in combination of two or more.

The photosensitive composition of the present invention may contain a thermosetting agent as the case requires, whereby the heat resistance and the water permeation resistance of the partition walls can be improved.

The thermosetting agent is not particularly limited and may, for example, be an amino resin (e.g. a melamine compound such as hexamethoxymethylolmelamine), a compound containing at least two epoxy groups, a compound containing at least two hydrazino groups, a polycarbodiimide compound, a compound containing at least two oxazoline groups, a compound containing at least two aziridine groups, a polyvalent metal, a compound containing at least two mercapto groups or a polyisocyanate compound, and they may be used in combination of two or more. Among them, considering the chemical resistance of the partition walls, preferred is an amino resin, a compound containing at least two epoxy groups or a compound containing at least two oxazoline groups.

To form partition walls by using the photosensitive composition of the present invention, it is preferred to form a coating film (wet film) by using a diluted liquid having the photosensitive composition diluted with a solvent, and then to remove the solvent by vaporization thereby to form a coating film of the photosensitive composition.

The solvent to dilute the photosensitive composition is not particularly limited and may, for example, be an alcohol such as ethanol, 1-propanol, 2-propanol, 1-butanol or ethylene glycol; a ketone such as acetone, methyl isobutyl ketone or cyclohexanone; a cellosolve such as 2-methoxyethanol, 2-ethoxyethanol or 2-butoxyethanol; a carbitol such as 2-(2-methoxyethoxy)ethanol, 2-(2-ethoxyethoxy)ethanol or 2-(2-butoxyethoxy)ethanol; an ester such as methyl acetate, ethyl acetate, n-butyl acetate, ethyl lactate, n-butyl lactate, ethylene glycol monomethyl ether acetate, ethylene glycol monoethyl ether acetate, diethylene glycol monomethyl ether acetate, diethylene glycol monoethyl ether acetate, diethylene glycol monobutyl ether acetate, propylene glycol monomethyl ether acetate, ethylene glycol diacetate, propylene glycol diacetate, ethyl 3-ethoxypropionate, cyclohexanol acetate, ethyl lactate, n-butyl lactate, γ-butyrolactone, 3-methoxybutyl acetate, 3-methyl-3-methoxybutyl acetate or glycerol triacetate; or an ether such as diethylene glycol dimethyl ether, diethylene glycol diethyl ether, diethylene glycol dibutyl ether, triethylene glycol dimethyl ether, tetraethylene glycol dimethyl ether, propylene glycol dimethyl ether, dipropylene glycol dimethyl ether, dibutyl ether or diethylene glycol methyl ethyl ether, and they may be used in combination of two or more. The diluted liquid has a solid content concentration of preferably from 5 to 40%, more preferably from 10 to 25%.

The photosensitive composition of the present invention may contain a curing accelerator, a thickener, a plasticizer, a defoaming agent, a leveling agent, an anti-repellent agent, an ultraviolet absorber, etc. as the case requires.

The partition walls of the present invention are formed by curing the photosensitive composition of the present invention, and can be applied to a black matrix of a color filter or an organic EL device.

Now, as one example of a process for producing partition walls of the present invention, a process for producing partition walls by photolithography using the photosensitive composition of the present invention will be described.

(Coating Step)

First, the diluted liquid of the photosensitive composition of the present invention is applied on a substrate. The substrate is not particularly limited and may, for example, be various types of glass plates; an inorganic substrate such as a SiC substrate or a silicon; an inorganic oxide substrate of e.g. ITO; a thermoplastic resin sheet of e.g. a polyester (such as polyethylene terephthalate), an polyolefin (such as polyethylene or polypropylene), a polycarbonate, a polymethyl methacrylate, a polysulfone, a polyimide or a poly(meth)acrylic resin; or a cured sheet of a thermosetting resin such as an epoxy resin or an unsaturated polyester. Considering the heat resistance, preferred is a glass plate or a heat resistant resin such as a polyimide. Further, the substrate is preferably transparent, whereby exposure from a side on which no partition walls are formed of the substrate is possible. Further, the substrate may be a substrate comprising a transparent substrate such as a glass substrate and an organic film or an inorganic oxide film of e.g. TFT, ITO or $SiO_2$ formed on the glass substrate or a patterned substrate, a substrate having an insulating film such as silicon nitrite or polyimide formed, or a laminated substrate having such substrates laminated.

The coating method is not particularly limited and may, for example, be a spin coating method, a spray coating method, a slit coating method, a roll coating method, a rotary coating method or a bar coating method.

(Drying Step)

Then, the coating film formed on the substrate is dried. By drying, the solvent is vaporized, whereby a coating film of the photosensitive composition having no adhesion will be obtained. The drying method is not particularly limited and may, for example, be vacuum drying or drying by heating. It is preferred to carry out vacuum drying and drying by heating in combination for efficient drying without non-uniformity in the outer appearance of the coating film. The drying conditions vary depending upon the types of the components contained in the photosensitive composition, the composition, etc., and preferably, the vacuum drying is carried out under from 10 to 500 Pa (absolute pressure) for from 10 to 300 seconds, and the drying by heating is carried out at from 50 to 120° C. for from 10 to 2,000 seconds.

(Exposure Step)

Then, exposure is carried out on the coating film via a mask having a predetermined pattern. The light to be applied is not particularly limited and may, for example, be visible light, ultraviolet rays, far ultraviolet rays, an excimer layer such as KrF excimer laser, ArF excimer laser, $F_2$ excimer laser, $Kr_2$ excimer laser, KrAr excimer laser or $Ar_2$ excimer laser, X-rays or electron beams. Light having a wavelength of from 100 to 600 nm is preferred, light having a wavelength of from 300 to 500 nm is more preferred, and i-line (365 nm), h-line (405 nm), or g-line (436 nm) is particularly preferred. As a light source, a known ultrahigh pressure mercury lamp may, for example, be used.

Light exposure is usually from 5 to 1,000 $mJ/cm^2$, preferably from 10 to 400 $mJ/cm^2$, more preferably from 20 to 200 $mJ/cm^2$, particularly preferably from 50 to 00 $mJ/cm^2$, based on the i-line. If the light exposure is less than 50 $mJ/cm^2$, curing of the coating film is inadequate, and the developability is decreased in some cases, and if it exceeds 400 $mJ/cm^2$, no high resolution can be obtained in some cases.

(Development Step)

Then, a non-exposed portion of the coating film is removed by an alkali developer to carry out development. The developer is not particularly limited and may, for example, be an aqueous solution of an alkali such as an inorganic alkali, an amine, an alcohol amine or a quaternary ammonium salt. The developing time i.e. the time during which the coating film is in contact with the developer is preferably from 5 to 180 seconds. The developing method is not particularly limited and may, for example, be a paddle method, a dipping method or a shower method.

After the development, washing with running water may be carried out, followed by drying with compressed air or compressed nitrogen to remove moisture on the substrate.

(Post-Exposure Step)

Then, post-exposure may be carried out on the developed partition walls. The exposure may be carried out from either the side on which partition walls are formed or the side on which no partition walls are formed, or may be carried out from both sides. The light to be applied is preferably ultraviolet rays.

As a light source, a known ultrahigh pressure mercury lamp or high pressure mercury lamp may, for example, be used. Such a light source emits light having a wavelength of at most 600 nm which contributes to curing of the partition walls, and emits little light having a wavelength of at most 200 nm which causes decomposition by oxidation of the partition walls. Further, it is preferred that a quartz tube glass used for the light source has an optical filter function to shield light having a wavelength of at most 200 nm.

The light exposure is usually at least 50 $mJ/cm^2$, preferably at least 200 $mJ/cm^2$, more preferably at least 1,000 $mJ/cm^2$, particularly preferably at least 2,000 $mJ/cm^2$.

Further, a low pressure mercury lamp may also be used as a light source. However, with a low pressure mercury lamp, emission of light having a wavelength of at most 200 nm is significant, and accordingly the light exposure is preferably at most 500 $mJ/cm^2$, more preferably at most 300 $mJ/cm^2$.

(Post Baking Step)

It is preferred to heat the partition walls after the development (in a case where post-exposure is carried, after the post-exposure). As the heating conditions, they are preferably heated at from 150 to 250° C. for from 5 to 90 minutes, and the heating temperature is more preferably at least 180° C. If the heating temperature is too low, the chemical resistance is insufficient in some cases, and accordingly, in a case where the partition walls are coated with an ink, the partition walls are swelled or the ink is bleed in some cases. On the other hand, if the heating temperature is too high, heat decomposition of the partition walls occurs in some cases.

As a heating device, a hot plate or an oven may, for example, be used.

By curing the photosensitive composition of the present invention by means of the above-described photolithography process, partition walls of the present invention are formed. Since the partition walls of the present invention are black, they can constitute a black matrix. That is, by forming partition walls, a black matrix can be formed.

The partition walls of the present invention have a width (average value) of preferably at most 100 μm, more preferably at most 20 μm. Further, the distance between adjacent partition walls, i.e. the width (average value) of open areas is preferably at most 300 μm, more preferably at most 100 μm. Further, the partition walls have a height (average value) of preferably from 0.05 to 50 μm, more preferably from 0.2 to 10 μm.

In general, as the ink repellency, the water repellency and the oil repellency may be mentioned, and they can be evaluated by the contact angles to water and 1-methoxy-2-acetoxypropane. The contact angle of the upper surface of the partition walls of the present invention to water is preferably at least 90°, more preferably at least 95°. Further, the contact angle of the upper surface of the partition walls to 1-methoxy-2-acetoxypropane is preferably at least 20°, more preferably at least 25°.

The color filter of the present invention comprises a substrate and a plurality of pixels formed on the substrate, wherein the plurality of pixels are partitioned by the partition walls of the present invention. As described above, the color filter of the present invention can be formed by forming partition walls (black matrix) on a substrate and then coating open areas of the black matrix with an ink by an ink jet method to form pixels.

The ink jet method is not particularly limited and may, for example, be a method of continuously jetting an electrified ink and controlling it by a magnetic field, a method of periodically spraying an ink by using piezoelectric elements, or a method of heating an ink and intermittently jetting it by utilizing its foaming.

The configuration of pixels is not particularly limited and may, for example, be a known configuration such as a stripe type, mosaic type, a triangle type or a 4-pixel configuration type.

The ink mainly comprises a coloring component, a binder resin component and a solvent, and may be either a water-base ink or an oil-base ink. The coloring component is preferably a pigment and/or a dye excellent in the heat resistance, the light resistance, etc. The binder resin component is preferably a transparent resin excellent in the heat resistance, such as an acrylic resin, a melamine resin or a urethane resin. The water-base ink comprises, as the solvent, water and, if necessary, a water-soluble organic solvent, and as the binder resin component, a water-soluble resin and/or a water-dispersible resin. Further, the oil-base ink comprises an organic solvent as the solvent and a resin soluble in the organic solvent as the binder resin component.

Further, after the open areas of the black matrix are coated with an ink by an ink jet method, it is possible to carry out drying, heat-curing, ultraviolet ray-curing, etc. as the case requires, Further, after pixels are formed on the open areas of the black matrix, an overcoat may be formed as the case requires, whereby the surface smoothness of a color filter can be improved and in addition, it is possible to prevent an elute from the black matrix or the pixels from reaching a liquid crystal layer adjacent to the overcoat.

When an overcoat is formed, it is preferred to remove the ink repellency on the upper surface of the black matrix before formation of the overcoat, whereby it is possible to prevent the upper surface of the black matrix from repelling the overcoating liquid. A method of removing the ink repellency on the upper surface of the black matrix is not particularly limited and may, for example, be plasma ashing method or photo ashing method.

Further, as the case requires, a photospacer may be formed on the black matrix so as to improve the product quality of a liquid crystal panel to be produced by using the color filter of the present invention.

The organic EL device of the present invention comprises a substrate and a plurality of pixels formed on the substrate, wherein the plurality of pixels are partitioned by the partition walls of the present invention. The organic EL device of the present invention can be produced as follows. First, a transparent electrode of e.g. ITO is formed by e.g. a sputtering method on a transparent substrate such as a glass plate, and as the case requires, the transparent electrode is etched to have a desired pattern. Then, in the same manner as in the case of the color filter, partition walls (black matrix) are formed on the substrate, and then by using an ink jet method, a solution of a hole transport material and a solution of a luminescent material as inks are sequentially applied on open areas of the black matrix and dried to form a hole transport layer and a luminescent layer. Then, an electrode of e.g. aluminum is formed by e.g. a vapor deposition method to form pixels, thereby to obtain an organic EL device.

EXAMPLES

Now, the present invention will be described in further detail with reference to Examples. However, it should be understood that the present invention is by no means restricted to such specific Examples. Part(s) means part(s) by mass.

Abbreviations of compounds used in the following respective Examples will be shown.

X-174DX: Dimethylsilicone chain-containing methacrylate X-22-174DX (manufactured by Shin-Etsu Chemical Co., Ltd.), X-8201: Dimethylsilicone chain-containing methacrylate X-24-8201 (manufactured by Shin-Etsu Chemical Co., Ltd.),

C6FMA: $CH_2=C(CH_3)COOCH_2CH_2(CF_2)_6F$,

MAA: Methacrylic acid,

2-HEMA: 2-Hydroxyethyl methacrylate,

IBMA: Isobornyl methacrylate,

V-70: V-70 (manufactured by Wako Pure Chemical Industries, Ltd., 2,2'-azobis(4-methoxy-2,4-dimethylvaleronitrile)), 2-ME: 2-Mercaptoethanol, AOI: Karenz AOI (manufactured by Showa Denko K.K., 2-Acryloyloxyethyl isocyanate), BEI: Karenz BEI (manufactured by Showa Denko K.K., 1,1-bis(acryloyloxymethyl)ethyl isocyanate), DBTDL: Dibutyltin dilaurate, BHT: 2,6-Di-t-butyl-p-cresol, MEK: 2-Butanone, OXE02: OXE02 (manufactured by Ciba Specialty Chemicals K.K., ethanone 1-[9-ethyl-6-(2-methylbenzoyl)-9H-carbazolyl-3-yl]-1-(O-acetyloxime) (a compound represented by the formula (5) wherein $R^1$ and $R^2$ are a methyl group, $R^3$ is an ethyl group, $R^4$, $R^6$ and $R^7$ are a hydrogen atom and $R^5$ is a 2-methylbenzoyl group), EX1010: EX-1010 (manufactured by Nagase ChemteX Corporation, a solution of a resin having an ethylenic double bond and an acidic group introduced to an epoxy resin represented by the formula (7); solid content: 70 mass %, weight average molecular weight: 3,020)

ZCR1569: ZCR-1569 (manufactured by NIPPON KAYAKU CO., LTD., a solution of a resin having an ethylenic double bond and an acidic group introduced to an epoxy resin having a biphenyl skeleton represented by the formula (6); solid content: 70 mass %, weight average molecular weight: 4,710), ZCR1629: ZCR-1629 (manufactured by NIPPON KAYAKU CO., LTD., a solution of a resin having an ethylenic double bond and an acidic group introduced to an epoxy resin having a biphenyl skeleton represented by the formula (6); solid content: 70 mass %, weight average molecular weight: 14,500), DPHA: KAYARAD DPHA (manufactured by NIPPON KAYAKU CO., LTD., a mixture of dipentaerythritol pentaacrylate and dipentaerythritol hexaacrylate)

A9300: NK ester A-9300 (manufactured by Shin-Nakamura Chemical Co., Ltd., ethoxylated isocyanuric acid triacrylate)

PGMEA: Propylene glycol 1-monomethyl ether 2-acetate

CB: Carbon black dispersion (average secondary particle size: 120 nm, dispersion medium: PGMEA, carbon black: 20%, polyurethane polymer dispersing agent having an amine value of 18 mgKOH/g: 5%), and Silica: silica dispersion (average particle size: 20 nm, dispersion medium: PGMEA, solid content: 30%, silica being negatively charged).

[Preparation of Polymer (A-1)]

Into an autoclave having an internal capacity of 1 L and equipped with a stirrer, MEK (420.0 g), X-174DX (5.4 g), MAA (18.0 g), 2-HEMA (99.0 g), IBMA (57.6 g) and a polymerization initiator V-70 (2.0 g) were charged, and polymerized at 30° C. for 24 hours with stirring in a nitrogen atmosphere to prepare a crude copolymer. To the obtained solution of the crude copolymer, heptane was added for reprecipitation for purification, followed by vacuum drying to obtain copolymer 1 (149.2 g). Copolymer 1 had a number average molecular weight of 17,100 and a weight average molecular weight of 50,500.

Into a glass flask having an internal capacity of 300 mL and equipped with a thermometer, a stirrer and a heating device, copolymer 1 (40.0 g), BEI (42.0 g), DBTDL (0.17 g), BHT (2.1 g) and MEK (115.4 g) were charged and reacted at 40° C. for 48 hours with stirring to prepare a crude polymer. To the obtained solution of the crude polymer, heptane was added for reprecipitation for purification, followed by vacuum drying to obtain polymer (A-1) (66.0 g). Polymer (A-1) had a number average molecular weight of 42,300, a weight average molecular weight of 119,990, a content of Si atoms of 0.55%, a content of ethylenic double bonds of $4.13 \times 10^{-3}$ mol/g and an acid value of 38.0 mgKOH/g.

[Preparation of Polymers (A-2) to (A-7), (R-1) and (R-2)]

In the same manner as in the preparation of polymer (A-1) except that mixing of materials was changed as shown in Table 1, polymers (A-2) to (A-5), (R-1) and (R-2) were obtained by means of preparation of copolymers 2 to 9. Of the obtained polymers, the yield, the number average molecular weight (Mn), the weight average molecular weight (Mw), the content of silicon atoms (Si), the content of fluorine atoms (F), the content of ethylenic double bonds (C=C) and the acid value are shown in Table 1.

TABLE 1

| | Polymer (A-1) | Polymer (A-2) | Polymer (A-3) | Polymer (A-4) | Polymer (A-5) | Polymer (A-6) | Polymer (A-7) | Polymer (R-1) | Polymer (R-2) |
|---|---|---|---|---|---|---|---|---|---|
| x-174DX | 5.4 | — | — | — | — | — | — | — | — |
| X-8201 | — | 27.0 | — | — | — | — | — | — | — |
| C6FMA | — | 66.6 | 81.0 | 81.0 | 81.0 | 93.6 | 111.6 | 81.0 | 81.0 |
| MAA | 18.0 | 14.4 | 18.0 | 18.0 | 18.0 | 14.4 | 14.4 | 18.0 | 18.0 |
| 2-HEMA | 99.0 | 72.0 | 72.0 | 72.0 | 72.0 | 63.0 | 54.0 | 72.0 | 72.0 |
| IBMA | 57.6 | — | 9.0 | 9.0 | 9.0 | 9.0 | — | 9.0 | 9.0 |
| V-70 | 2.0 | 1.4 | 2.9 | 0.9 | 1.2 | 2.3 | 2.3 | 5.8 | 5.8 |
| 2-ME | — | — | — | — | — | — | — | — | 3.5 |
| MEK | 420 | 420 | 420 | 420 | 420 | 420 | 420 | 420 | 420 |
| Copolymer 1 | 40 | — | — | — | — | — | — | — | — |
| Copolymer 2 | — | 40 | — | — | — | — | — | — | — |
| Copolymer 3 | — | — | 50 | — | — | — | — | — | — |
| Copolymer 4 | — | — | — | 50 | — | — | — | — | — |
| Copolymer 5 | — | — | — | — | 40 | — | — | — | — |
| Copolymer 6 | — | — | — | — | — | — | — | 40 | — |
| Copolymer 7 | — | — | — | — | — | — | — | — | 40 |
| Copolymer 8 | — | — | — | — | — | 50 | — | — | — |
| Copolymer 9 | — | — | — | — | — | — | 50 | — | — |
| BEI | 42.0 | 30.5 | — | — | 30.5 | — | — | 30.5 | 30.5 |
| AOI | — | — | 21.7 | 21.7 | — | 13 | 16.3 | — | — |
| DBTDL | 0.17 | 0.12 | 0.087 | 0.087 | 0.12 | 0.052 | 0.065 | 0.12 | 0.12 |
| BHT | 2.1 | 1.5 | 1.1 | 1.1 | 1.5 | 0.66 | 0.83 | 1.5 | 1.5 |
| MEK | 115.4 | 109.4 | 128.1 | 128.1 | 109.4 | 148.7 | 156.8 | 109.4 | 109.4 |
| Yield (g) | 66.0 | 60.1 | 63.8 | 64.5 | 59.9 | 60.1 | 64.2 | 57.5 | 56.3 |
| Mn | 42300 | 36150 | 27690 | 50610 | 52100 | 35410 | 35830 | 17250 | 7320 |
| Mw | 119990 | 114000 | 61110 | 122260 | 165090 | 91780 | 86610 | 47060 | 10490 |
| Si content (%) | 0.55 | 3.12 | — | — | — | — | — | — | — |
| F content (%) | — | 12.0 | 20.7 | 20.5 | 19.5 | 23.6 | 26.2 | 18.8 | 18.5 |
| C = C Content ($\times 10^{-3}$ mol/g) | 4.13 | 3.49 | 2.15 | 2.19 | 3.20 | 1.47 | 1.74 | 3.30 | 3.49 |
| Acid value (mgKOH/g) | 38.0 | 29.6 | 45.5 | 44.1 | 38.8 | 41.4 | 39.4 | 38.8 | 49.5 |

The number average molecular weight and the weight average molecular weight were measured by means of a gel permeation chromatography method using polystyrene as the standard substance. In gel permeation chromatography, HPLC-8220GPC (manufactured by TOSOH CORPORATION) was used. As the column, one comprising three shodex LF-604 columns connected was used. As the detector, an RI detector was used. As the standard substance, EasiCal PS1 (manufactured by Polymer Laboratories) was used. Further, when the number average molecular weight and the weight average molecular weight were measured, the column was kept at 37° C., tetrahydrofuran was used as an eluent at a flow rate of 0.2 mL/min, and 40 µL of a 0.5% tetrahydrofuran solution of the sample to be measured was injected.

The content of silicon atoms in the polymer is a theoretical value calculated from the blend proportions of monomers as the materials.

The content of fluorine atoms in the polymer was calculated by $^{19}$F NMR measurement using 1,4-ditrifluoromethylbenzene as the standard substance.

The content of ethylenic double bonds in the polymer was calculated by $^{1}$H NMR measurement using 1,4-ditrifluoromethylbenzene as the standard substance.

The acid value is a theoretical value calculated from the blend proportions of monomers as the materials.

Example 1

Polymer (A-1) (0.22 part), CB (58.9 parts) as a dispersion of the black colorant (B), OXE02 (2.1 parts) as the photopolymerization initiator (C), EX1010 (13.1 parts) as a dispersion of the photosensitive resin (D), DPHA (3.9 parts) as the crosslinking agent (E) and PGMEA (21.7 parts) as a solvent were mixed to obtain a diluted liquid of a photosensitive composition. The content of polymer (A-1) in the total solid content of the diluted liquid of the photosensitive composition was 0.74%.

The diluted liquid of the photosensitive composition was applied on a glass substrate by using a spinner, and dried on a hot plate at 100° C. for 2 minutes to form a coating film of the photosensitive composition having a thickness of 2.0 µm. Then, via a mask, the coating film was irradiated with light with a light exposure of 100 mJ/cm$^2$ based on the i-line (365 nm) using a ultrahigh pressure mercury lamp for exposure. The mask has a lattice pattern with a light transmitting portion of 100 µm×200 µm and a light shielding portion of 20 µm, and the volume of open areas to be formed is 40 µL. Then, the glass substrate was immersed in an aqueous solution comprising an inorganic alkali type developer SemiClean DL-A4 (manufactured by YOKOHAMA OILS & FATS INDUSTRY CO., LTD.) diluted 10 times for development, and a non-exposed portion was washed with water and dried. Then, the glass plate was heated on a hot plate at 220° C. for 30 minutes to obtain glass substrate (1) having partition walls formed thereon.

Further, in the same manner as described above except that exposure was carried out without use of a mask, glass substrate (2) having a cured product of a coating film of the photosensitive composition formed thereon was obtained.

Examples 2 to 8 and Comparative Examples 1 and 2

In the same manner as in Example 1 except that mixing of the respective components was changed as shown in Table 2, glass substrates (1) having partition walls formed thereon and glass substrates (2) having a cured product of a coating film of the photosensitive composition formed thereon were obtained.

[Evaluation Methods and Evaluation Results]

Using glass substrates (1) and (2) in Examples 1 to 6 and Comparative Examples 1 and 2, the developability, the water- and oil-repellency, and the ink spreadability within open areas were evaluated by the following methods. The evaluation results are shown in Table 2.

(f) illustrate evaluation results of the ink spreadability within open areas in Examples 3, 5 and 6, Comparative Examples 1 and 2, and Example 7, respectively.

One having open areas covered with the ink and having no portion repelling the ink was identified by ○, and one having a portion repelling the ink was identified by x.

TABLE 2

|  |  | Ex. | | | | | | | | Comp. Ex. | |
| --- | --- | --- | --- | --- | --- | --- | --- | --- | --- | --- | --- |
|  |  | 1 | 2 | 3 | 4 | 5 | 6 | 7 | 8 | 1 | 2 |
| Polymer (A) or Polymer (R) |  | (A-1) 0.22 | (A-2) 0.22 | (A-3) 0.09 | (A-4) 0.09 | (A-5) 0.09 | (A-5) 0.09 | (A-6) 0.04 | (A-7) 0.04 | (R-1) 0.11 | (R-2) 0.15 |
| Dispersion of black colorant (B) | CB | 58.9 | 58.9 | 43.4 | 43.4 | 43.4 | 59 | 43.5 | 43.5 | 43.4 | 43.4 |
| Photopolymerization initiator (C) | OXE02 | 2.1 | 2.1 | 1.7 | 1.7 | 1.7 | 2.1 | 1.7 | 1.7 | 1.7 | 1.7 |
| Solution of photosensitive resin (D) | EX1010 | 13.1 | 13.1 | — | — | — | — | — | — | — | — |
|  | ZCR1569 | — | — | 14.5 | 14.5 | 14.5 | — | 14.5 | 14.5 | 14.5 | 14.5 |
|  | ZCR1629 | — | — | — | — | — | 13.1 | — | — | — | — |
| Radial crosslinking agent (E) | DPHA | 3.9 | 3.9 | — | — | — | 3.9 | 4.3 | 4.3 | — | — |
|  | A9300 | — | — | 4.3 | 4.3 | 4.3 | — | — | — | 4.3 | 4.3 |
| Fine particles | Silica | — | — | 9.7 | 9.7 | 9.7 | — | 9.7 | 9.7 | 9.7 | 9.7 |
| Diluting agent | PGMEA | 21.7 | 21.7 | 26.3 | 26.3 | 26.3 | 21.7 | 26.3 | 26.3 | 26.3 | 26.3 |
| Proportion (%) of polymer (A) or polymer (R) in total solid content |  | 0.74 | 0.74 | 0.30 | 0.30 | 0.30 | 0.31 | 0.14 | 0.14 | 0.35 | 0.5 |
| Developability |  | ○ | ○ | ○ | ○ | ○ | ○ | ○ | ○ | ○ | ○ |
| Water repellency |  | ○ | ○ | ○ | ○ | ○ | ○ | ○ | ○ | ○ | ○ |
| Oil repellency |  | ○ | ○ | ○ | ○ | ○ | ○ | ○ | ○ | ○ | ○ |
| Ink spreadability |  | ○ | ○ | ○ | ○ | ○ | ○ | ○ | ○ | X | X |

[Developability]

Glass substrate (1) on which the partition walls could be completely developed was identified by ○, and one having a portion not developed was identified by x.

[Water Repellency]

The water repellency was evaluated by measuring the contact angle on the surface of the coating film cured product on glass substrate (2) to water. The contact angle is an angle between the solid surface and the tangent line against the liquid surface at a point where the solid and the liquid are in contact with each other, and is defined by the angle on the side containing the liquid. The larger the angle, the better the water repellency of the coating film cured product.

The contact angle to water being at least 95° was represented by ○, and the same contact angle being less than 90° was represented by x.

[Oil Repellency]

The oil repellency was evaluated by measuring the contact angle on the surface of the coating film cured product on glass substrate (2) to PGMEA. The contact angle is as defined for the water repellency, and the larger the contact angle, the better the oil repellency of the coating film cured product.

The contact angle to PGMEA being at least 25° was represented by ○, and the same contact angle being less than 20° was represented by x.

[Ink Spreadability within Open Areas]

Liquid epoxy ME-562 (manufactured by PELNOX, LTD.) (6.25 g), a curing agent HV-562 (manufactured by PELNOX, LTD.) (6.25 g), diethyl adipate (12.5 g) and diethyl malonate (25.0 g) were stirred and mixed by a stirrer for 1 hour to prepare an ink.

The open areas of glass substrate (1) were coated with about 20 pL of the ink by means of an ink jet method, and photographs taken by using an ultra deep shape measuring microscope VK-8500 (manufactured by KEYENCE CORPORATION) were observed to evaluate the ink spreadability within open areas (see FIG. 1). FIGS. 1(a), (b), (c), (d), (e) and Even in a case where the open areas with a volume of 40 pL were coated with about 20 pL of the ink, that is, a case where the ink application amount was small, in glass substrates (1) in Example 1 to 6 with a polymer (A) having a number average molecular weight of from $2 \times 10^4$ to $7 \times 10^4$ and a weight average molecular weight of from $5 \times 10^4$ to $25 \times 10^4$, the ink spread within the open areas, and there was no edge leakage.

On the other hand, in glass substrates (1) in Comparative Examples 1 and 2 with a polymer (R) having a number average molecular weight of less than $2 \times 10^4$ and a weight average molecular weight of less than $5 \times 10^4$, there was a portion where the ink did not spread within the open areas.

INDUSTRIAL APPLICABILITY

The photosensitive composition of the present invention is useful for a color filter and an organic EL device having partition walls.

The entire disclosure of Japanese Patent Application No. 2008-174974 filed on Jul. 3, 2008 including specification, claims, drawings and summary is incorporated herein by reference in its entirety.

What is claimed is:

1. A photosensitive composition, which comprises a polymer (A) having a side chain containing a group represented by the formula:

$$-CFXR^f \quad (1)$$

wherein X is a hydrogen atom, a fluorine atom or a trifluoromethyl group, $R^f$ is a $C_{1-20}$ fluoroalkyl group which may have an etheric oxygen atom or a fluorine atom, or a group represented by the formula:

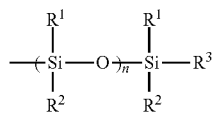

(2)

wherein each of $R^1$ and $R^2$ which are independent of each other, is a hydrogen atom, an alkyl group, a cycloalkyl group or an aryl group, $R^3$ is a hydrogen atom or a $C_{1-10}$ organic group, and n is an integer of at least 1 and at most 200; and a side chain containing an ethylenic double bond, a black colorant (B), a photopolymerization initiator (C), and a photosensitive resin (D) containing an acidic group and an ethylenic double bond, wherein the polymer (A) has a number average molecular weight of at least $2\times10^4$ and at most $7\times10^4$ and a weight average molecular weight of at least $5\times10^4$ and at most $25\times10^4$.

2. The photosensitive composition according to claim 1, wherein the polymer (A) is a polymer (A) having a side chain containing a group represented by the above formula (1) and a side chain containing an ethylenic double bond, and the content of fluorine atoms in the polymer (A) is from 5 to 35 mass %.

3. The photosensitive composition according to claim 1, wherein the polymer (A) is a polymer (A) having a side chain containing a group represented by the above formula (2) and a side chain containing an ethylenic double bond, and the content of silicon atoms in the polymer (A) is from 0.1 to 25 mass %.

4. The photosensitive composition according to claim 1, wherein the photosensitive resin (D) has a weight average molecular weight of at least $1.5\times10^3$ and at most $20\times10^3$.

5. The photosensitive composition according to claim 1, wherein the polymer (A) has ethylenic double bonds in an amount of from 1.0 to 5.0 mmol/g.

6. The photosensitive composition according to claim 1, wherein the group represented by the above formula (1) is a perfluoroalkyl group.

7. The photosensitive composition according to claim 1, wherein the polymer (A) further has a side chain containing an acidic group.

8. The photosensitive composition according to claim 1, which further contains a crosslinking agent (E) containing at least two ethylenic double bonds.

9. Partition walls formed by curing the photosensitive composition as defined in claim 1.

10. A color filter, which comprises a substrate and a plurality of pixels formed on the substrate, wherein the plurality of pixels are partitioned by the partition walls as defined in claim 9.

11. An organic EL device, which comprises a substrate and a plurality of pixels formed on the substrate, wherein the plurality of pixels are partitioned by the partition walls as defined in claim 9.

* * * * *